United States Patent
Kawamoto et al.

(10) Patent No.: US 6,347,584 B1
(45) Date of Patent: Feb. 19, 2002

(54) METHOD OF MANUFACTURING ELECTRONIC COMPONENTS USING INTAGLIO PLATE HAVING DUAL RELEASING LAYERS

(75) Inventors: Eiji Kawamoto, Ibaraki; Kazuhiro Miura, Osaka; Masaaki Hayama, Nara; Yoshihisa Takase, Higashiosaka, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/589,346

(22) Filed: Jun. 8, 2000

(30) Foreign Application Priority Data

Jun. 11, 1999 (JP) .......................................... 11-164894

(51) Int. Cl.$^7$ .............................. B41N 1/06; B41N 3/00
(52) U.S. Cl. ........................ 101/170; 101/401; 156/289
(58) Field of Search ................................ 101/150, 153, 101/163, 170, 401; 427/322, 327, 409, 412.1; 156/289

(56) References Cited

U.S. PATENT DOCUMENTS 4,418,641 A * 12/1983 Nakashima et al. ........ 118/429
5,127,330 A * 7/1992 Okazaki et al. ............. 101/170
5,201,268 A * 4/1993 Yamamoto et al. ......... 101/170
5,609,704 A * 3/1997 Hayama et al. ............. 156/289
5,851,598 A * 12/1998 Gallant ....................... 427/515

FOREIGN PATENT DOCUMENTS

| JP | 4-246594 | 9/1992 |
| JP | 4-332694 | 11/1992 |
| JP | 7-169635 | 7/1995 |

* cited by examiner

Primary Examiner—Stephen R. Funk
(74) Attorney, Agent, or Firm—Parkhurst & Wendel, L.L.P

(57) ABSTRACT

A method of manufacturing electronic components using intaglio transfer printing for improving printing yield. Intaglio 1 having a dual releasing layer structure is used. In this structure, first releasing layer 2 is formed on the surface of intaglio 1 by chemical absorption, and second releasing layer 3 is formed on the first releasing layer by physical adsorption. This structure allows intaglio 1 to have stable releasing ability, thereby improving the printing yield. In addition, because second releasing layer 3 can be added as required, the printing yield is not decreased even when the intaglio is repeatedly used for printing. Furthermore, the dual releasing layer structure can improve durability of the releasing ability of intaglio 1. As a result, patterns for electronic components can be formed on substrates at an excellent yield.

9 Claims, 4 Drawing Sheets

METHOD OF MANUFACTURING ELECTRONIC COMPONENTS USING INTAGLIO PLATE HAVING DUAL RELEASING LAYERS

FIELD OF THE INVENTION

The present invention relates to a method of manufacturing electronic components for use in electronic equipment. More particularly, the present invention is a method of manufacturing electronic components using intaglio printing.

BACKGROUND OF THE INVENTION

The recent trend towards the downsizing of electronic equipment has created a corresponding need for the downsizing of electronic components. Under these circumstances, it is desired in the conductor patterns of electronic components that conductors constituting the patterns should be finer and conductive films should be thicker for reduction of conductor resistance. Further size reduction requires multi-lamination of circuit boards.

To meet these requirements, for example, Japanese Patent Laid-Open Publication No. H07-169635, discloses an intaglio printing method using an intaglio made of a flexible film and having a fine wiring pattern groove processed thereon.

In an ordinary intaglio printing method, conductive paste is left inside of the intaglio and the remaining paste often causing printing failures. Therefore, in the method disclosed above, a releasing layer made of a fluorocarbon releasing agent is formed over the surface of the intaglio so that the conductive paste, the substance to be transferred, can be transferred onto a substrate efficiently. This layer allows the conductive paste filled in the intaglio to be easily removed therefrom, thereby reducing printing failures.

The materials and method of forming the above-mentioned releasing layer are disclosed in Japanese Patent Laid-Open Publication No. H04-246594 and Japanese Patent Laid-Open Publication No. H04-332694. That is, as illustrated in FIG. 5, to dip intaglio 21 into solution 22 containing releasing agent dissolved therein to form a releasing layer on the surface of the intaglio. The intaglio is treated in vessel 30 using a fluorocarbon silane releasing agent. Sometimes during the treatment, bubbles 40 may be entrapped in recesses of the intaglio.

The above-mentioned intaglio printing method, however, has a problem with durability of the releasing layer in that the releasing layer on the surface of the intaglio comes off every time it is used for printing and thus the releasing ability deteriorates. As patterns to be printed become finer, finer grooves must be processed on the intaglio. Therefore, in the method of forming a releasing layer on the surface of an intaglio by dipping, the intaglio may be dipped with bubbles entrapped inside of its grooves. In this case, only dipping it even for a long time will not help removing the bubbles entrapped inside of the grooves. For such a reason, the method has a problem in that the bubbles prohibit the contact between the inner walls of the grooves and the releasing agent, so that uniform releasing layer cannot be formed over the whole intaglio. Consequently, the conductive paste is not efficiently transferred from the intaglio onto the substrate and thus such failures as breakage or deformation of wiring patterns are likely to occur.

SUMMARY OF THE INVENTION

The present invention is to address the above-mentioned problems. It is, therefore, the object of the prevent invention to realize releasing ability of an intaglio that will not deteriorate even after the intaglio is repeatedly used for printing, and to form a uniform releasing layer over the surface of the intaglio, particularly the inner walls of its micro-processed grooves.

According to the present invention, to accomplish the above-mentioned object, a dual releasing layer is formed on the surface of an intaglio. A first releasing layer directly formed on the intaglio is chemically adsorbed on the substrate of the intaglio; and a second releasing layer formed on the first releasing layer is physically adsorbed on the first layer. In addition, according to the present invention, ultrasonic vibration is applied when the releasing layers are formed over the intaglio.

This method can prevent printing failures previously caused by deterioration of the releasing layer after repeated use of the same intaglio. That is, since the second layer is physically adsorbed on the first layer, the conductive paste peels off from the intaglio at the interface between the second layer and the conductive paste or at the interface between the first and second layers at printing. This ensures printing of the conductive paste onto the substrate. The second layer also serves as a protective layer of the first layer, thus protecting the first layer from deterioration every time the intaglio is used for printing. Furthermore, only adsorbed on the first layer, the second layer can be added prior to printing as required. When the first layer is unevenly formed, the second layer complements the first layer, so that releasing ability of the intaglio is kept constant. In contrast, when the second layer is unevenly formed, releasing ability of the intaglio can be kept constant because the first layer is formed. In addition, when the intaglio is dipped into a solution containing a releasing agent for forming a releasing layer on the surface of the intaglio, ultrasonic vibration is applied. The ultrasonic vibration can remove the bubbles entrapped in the grooves of the intaglio, thus ensuring the reaction of the releasing agent with the intaglio and allowing formation of a uniform releasing layer on the surface of the intaglio.

DESCRIPTION OF THE PREFERRED EMBODIMENT

An exemplary embodiment of the present invention will be described below with reference to FIG. 1 to FIG. 4.

Figure 1:
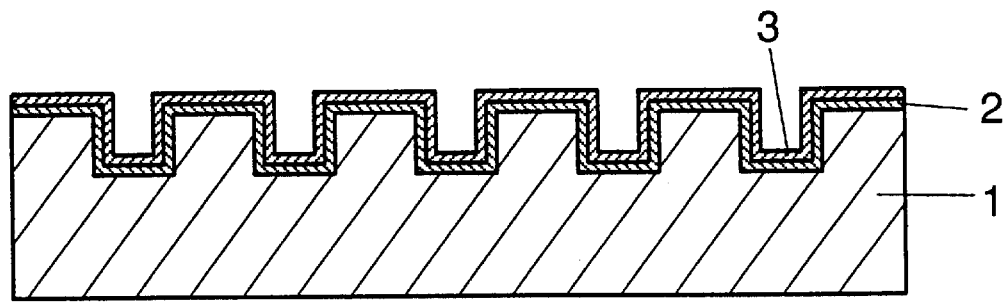
FIG. 1 is a sectional view of an intaglio in accordance with an embodiment of the present invention.

FIG. 1 shows a sectional view of an intaglio in accordance with the embodiment. The intaglio has a first releasing layer 2 formed on the surface of the intaglio and a second releasing layer 3 formed on the first releasing layer 2.

Figure 2:
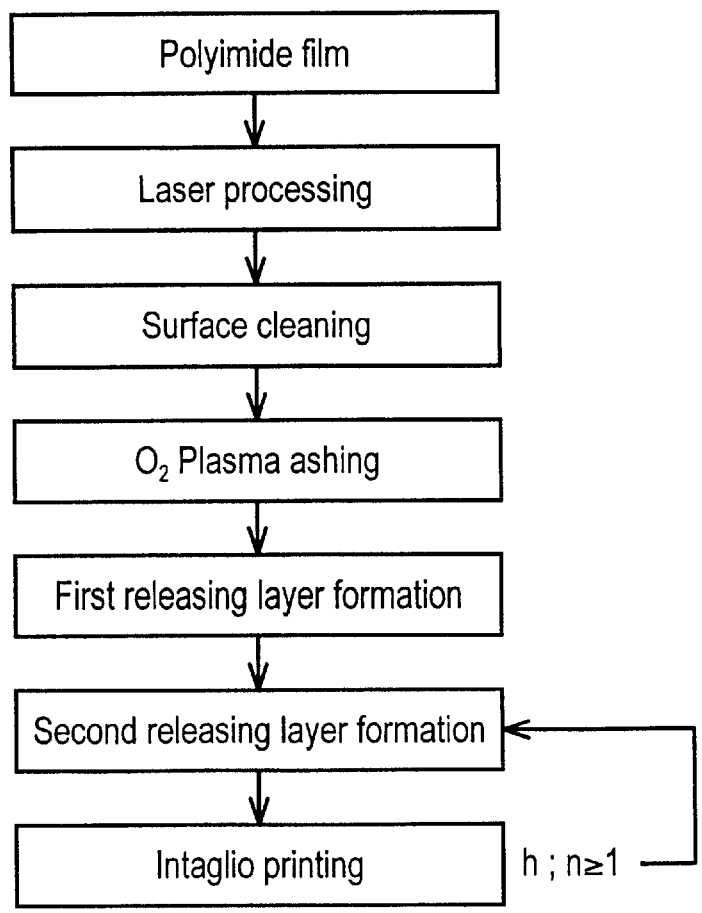
FIG. 2 is a flowchart showing surface treatment of an intaglio in accordance with the same embodiment.
Figure 3:
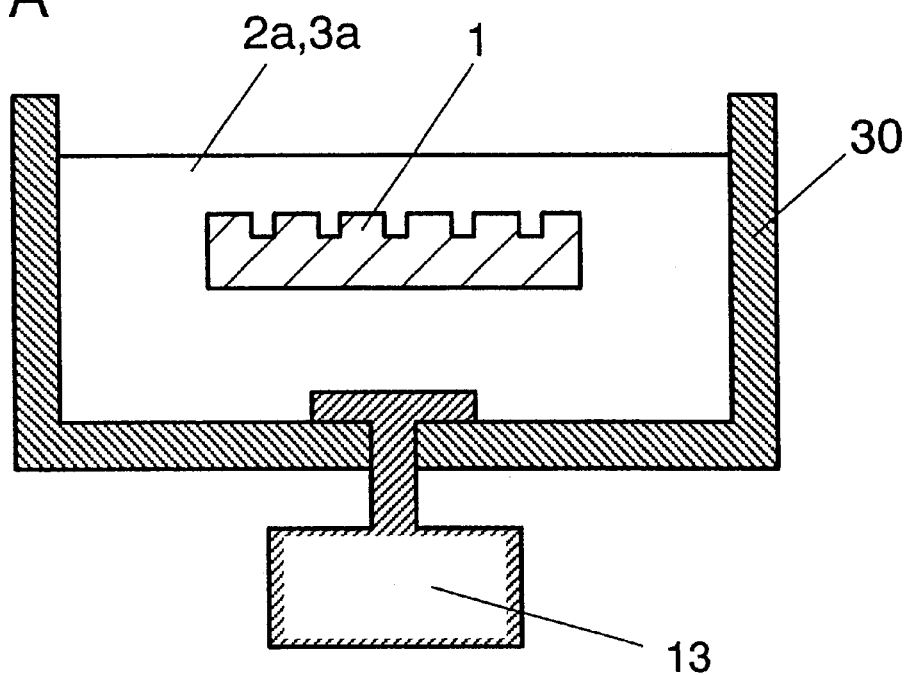
FIG. 3A and 3B illustrate methods of surface treatment of an intaglio in accordance with the same embodiment.
Figure 3:
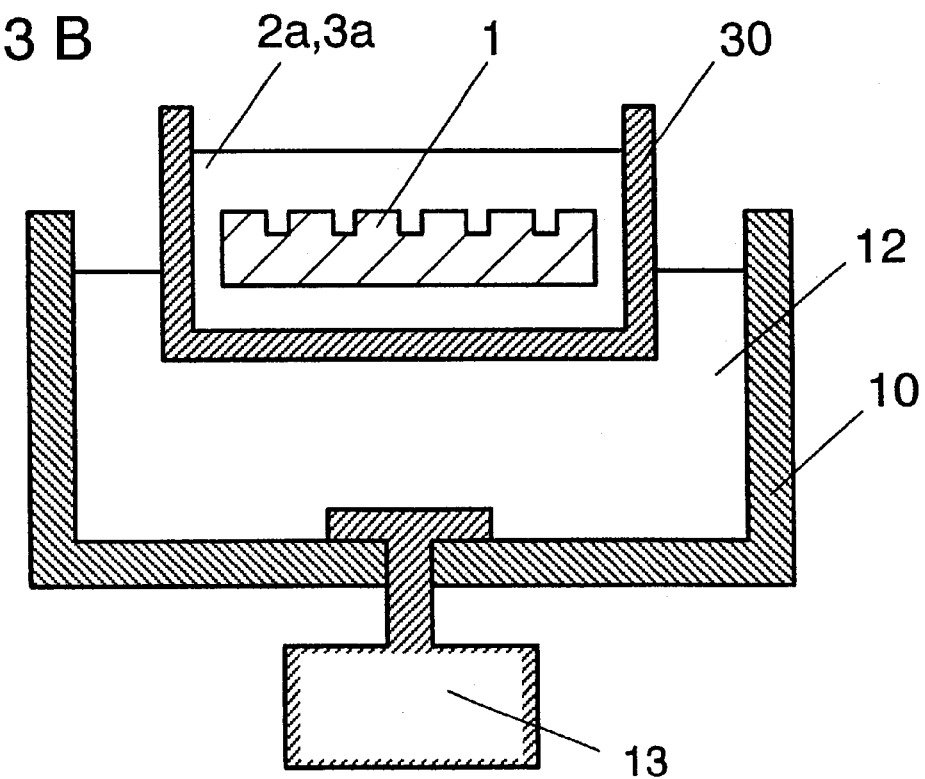

FIG. 2 shows a surface treatment process of intaglio 1. First, grooves 5 for producing wiring pattern 11 are formed on a 125 µm thick polyimide film 4 by excimer laser irradiation. In this embodiment, grooves 5 corresponding to wiring pattern 11 are made 25 µm wide and 30 µm deep. As a flexible resin substrate of intaglio material, any material decomposed by photochemical reaction by an excimer laser can be used. Other than the above mentioned polyimide film, commercially available resin films or sheets such as polyethylene terephthalate (PET), polyethylene naphthalate (PEN), polyether imide (PEI) or the like can be used.

When polyimide film 4 used as a material of intaglio 1 is not coated, conductive paste 6 filled in grooves 5 and transferred to the substrate is not sufficiently released from polyimide film 4. Thus conductive paste 6 is likely to remain inside of grooves 5 in the process of transferring conductive paste 6 onto the substrate. Then releasing layer 7 is formed on the surface of The method of forming the releasing layers includes a step of cleaning the surface of intaglio 1 having grooves 5 laser-processed thereon with an organic solvent, such as acetone, followed by a step of performing surface treatment by plasma ashing with oxygen or another gas.

Next, intaglio 1 is dipped into a non-aqueous organic solvent containing first releasing agent 2a dissolved therein. An example of a first releasing agent is a perfluoro alkyl group containing silane compound. Non-aqueous organic solvents such as cyclohexane, can be used as the solvent.

As a first releasing agent 2a, a silane compound having functional groups likely to be hydrolyzed, such as chlorosilyl groups, should be selected so as to react with intaglio 1. These chlorosilyl groups of the first releasing agent 2a are instantaneously hydrolyzed in the presence of water and a hydrogen chloride elimination reaction occurs. By utilizing this property, the functional groups react with the hydroxyl groups generated on the surface of intaglio 1 by plasma treatment or the like.; and thereby the first releasing agent 2a can be chemically adsorbed thereon. The functional groups of silane compounds are not limited to the above-mentioned chlorosilyl groups, and silane compounds having alkoxy or hydroxyl groups can be used. When a silane compound having such functional groups is chemically adsorbed, heating may be applied.

For adsorbing first releasing agent 2a as much as possible, more hydroxyl groups are required on the surface of the intaglio 1. In this embodiment, therefore, the surface of intaglio 1 is forcefully oxidized by oxygen plasma in advance so that the quantity of hydroxyl groups on the surface of intaglio 1 is increased. Meanwhile, since chlorosilyl groups are easily hydrolyzed by water in the air as well, the treatment of first releasing layer 2 is preferably performed in an atmosphere of nitrogen or an inert gas so that the first releasing agent is completely shielded from the air. When other silane compounds are used for the reaction, it may be performed in the air. Considering the reaction conditions and time of the reaction, the use of a silane compound containing chlorosilyl groups is preferred. This method allows efficient formation of first releasing layer 2 on the surface of intaglio 1.

Next, in order to form second releasing layer 3, intaglio 1 coated with first releasing layer 2 on its surface is dipped into a non-aqueous organic solvent containing stable second releasing agent 3a, such as fluoro-silicone compounds, dissolved therein. This second layer 3 is only physically adsorbed on first layer 2, involving no chemical reaction. Therefore, a stable compound having no functional groups should be used for second releasing layer 3. The treatment process of second layer 3 simply includes a step of dipping the intaglio into the organic solvent containing the second releasing agent 3a dissolved therein, followed by a step of removing the intaglio for air drying or drying in an oven.

During this drying step, only the organic solvent evaporates and second releasing agent 3a is left on the surface of intaglio 1. As a result, second releasing layer 3 physically adsorbed on first releasing layer 2 can be formed efficiently.

Each of first and second layers 2 and 3 is formed by dipping. As grooves 5 become finer, bubbles are more likely to be trapped inside of the grooves 5 during the dipping step. The presence of bubbles may inhibit the reaction between the intaglio surface and respective releasing agents 2a, 3a, thus making it difficult to form the first and second releasing layers 2, 3 on the surface of the intaglio. This problem is easily solved, as illustrated in FIGS. 3A and 3B, by applying ultrasonic vibration during the dipping step using an ultrasonic generator 13 directly attached to vessel 30 containing a non-aqueous organic solvent containing first or second release agent 2a, 3a, as shown in FIG. 3A. The ultrasonic treatment may be processed indirectly, for example, via water 12 contained in a second vessel 10, as shown in FIG. 3B. Originally, the bubbles are only physically adsorbed on the surface of intaglio 1 and no chemical bonds are involved. Therefore, the bubbles can easily be eliminated from the surface of intaglio 1 simply by applying ultrasonic vibration.

Figure 4:
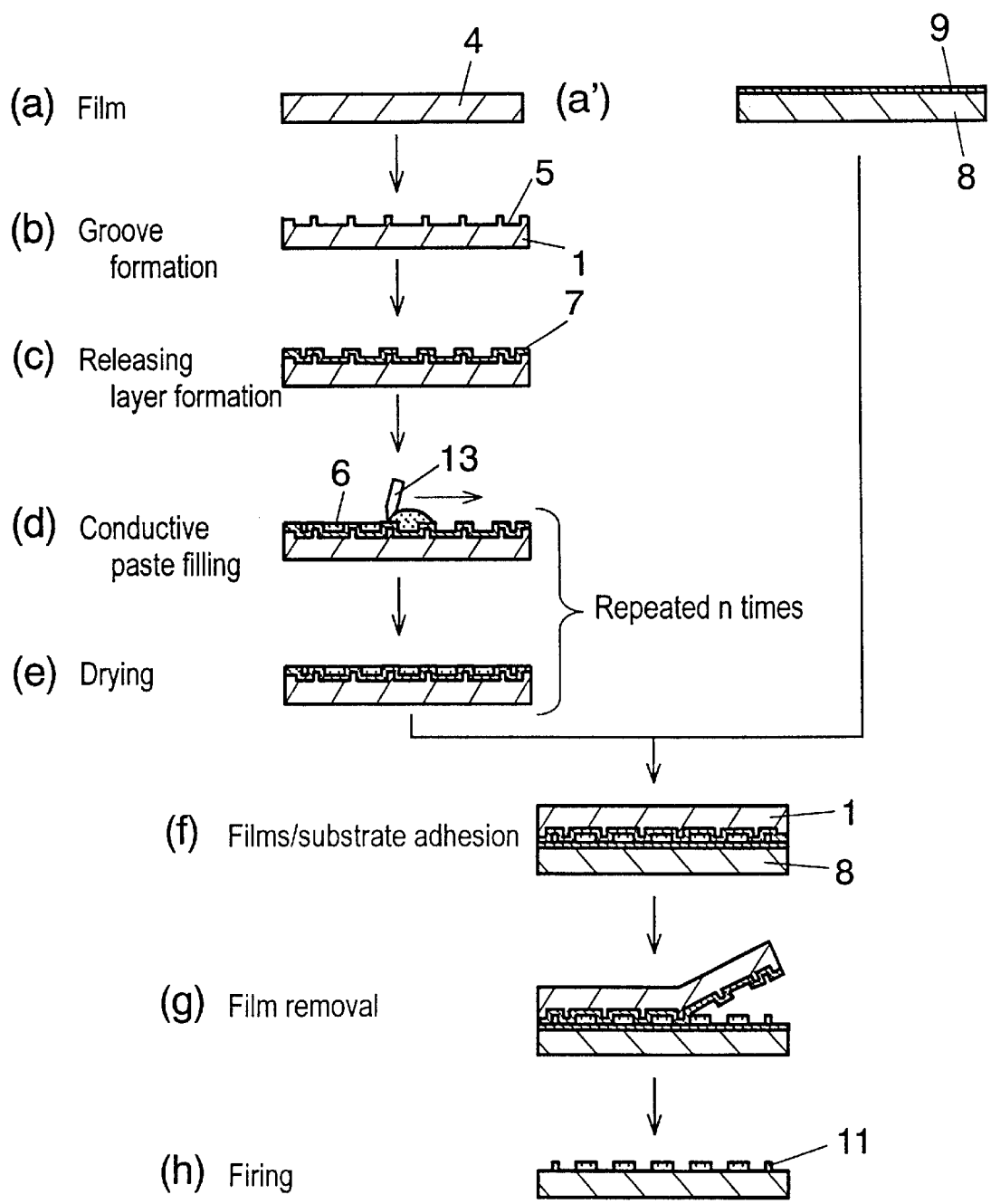
FIG. 4 is a process chart of intaglio printing in accordance with the same embodiment.
Figure 5:
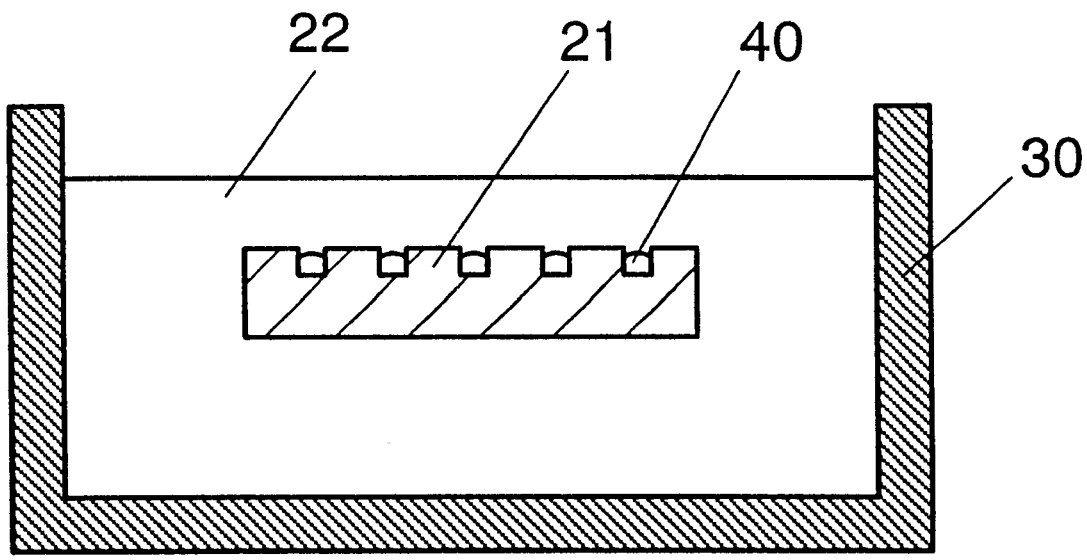
FIG. 5 illustrates a conventional method of surface treatment of an intaglio.

Next, a process chart of intaglio printing in accordance with the present invention will be shown in FIG. 4. As conductive paste 6, Ag/Pd paste is applied on the surface of intaglio 1 coated with dual releasing layer 7 of first and second releasing layers 2 and 3. By scribing the surface of intaglio 1 with a squeegee 13 after the application, conductive paste 6 is only filled in the grooves 5 and excess conductive paste 6 on the surface of intaglio 1 is removed. Subsequently, the intaglio 1 filled with conductive paste 6 is dried in a drying oven so that the organic solvent contained in the conductive paste 6 evaporates. After the organic solvent has evaporated, the conductive paste 6 decreases in volume and thus forms recesses in grooves 5. Additional conductive paste 6 fills the recesses and drys in similar manner so that the organic solvent contained in the additional conductive paste 6 evaporates. Then, recesses are formed again in grooves 5. After the steps of filling and drying the conductive paste 6 are repeated, grooves 5 are finally filled with dried conductive paste. In this embodiment, the filling step and drying step have each been repeated four times.

Meanwhile, an adhesion layer 9 of thermoplastic resin is formed on a ceramic substrate 8 so that the conductive paste 6 is transferred onto it. Next, the intaglio 1 is placed so that its conductive paste 6 filled surface faces towards the adhesion layer 9. The intaglio 1 and ceramic substrate 8 bond together by applying heat and pressure.

Subsequently, after the temperature of bonded intaglio 1 and ceramic substrate 8 is lowered to room temperature, the intaglio 1 is peeled from the ceramic substrate 8 so that the conductive paste 6 forming a wiring pattern 11 is transferred thereon. At this time, since the first and second releasing layers 2, 3 are coated one over the other to form a dual releasing layer 7 on the surface of the intaglio 1, conductive paste 6 can be peeled from intaglio 1 easily.

Thereafter, the ceramic substrate 8 having conductive paste 6 transferred thereon is fired at a peak temperature of 850° C.

By the above-mentioned steps, the wiring pattern 11 can be formed on the ceramic substrate 8. This wiring pattern 11 has a minimum pattern width of $20\mu m$ and a film thickness of $18\mu m$. The minimum pattern width is smaller than the width of grooves 5 because the conductive paste 6 shrunk by the firing. In this embodiment, wiring pattern 11 has a resistance of 0.4 ohms in its longest wiring; and the conductor of the wiring pattern has a surface resistance of 2.1 mohms/square. As shown above, extremely small wiring resistance can be obtained.

When this intaglio 1 is repeatedly used for printing the wiring pattern 11, additional conductive paste 6 can be filled and dried prior to printing in a manner similar to the above. In this case, as the intaglio is repeatedly used, more conductive paste 6 is left inside of the grooves 5, thus increasing printing failures. This is because the second releasing layer 3 formed on the surface of the intaglio 1 decreases and thereafter the first releasing layer 2 also decreases by the repeated use of the intaglio for printing. To solve this problem, the second releasing layer 3 is additionally formed on the first releasing layer 2 on the surface of intaglio 1 in a manner similar to that discussed above. Again this can improve the releasing ability of the intaglio 1. Moreover, the second releasing layer 3 uniformly formed again can also serve as a protective layer for the first releasing layer 2, thus preventing deterioration of the first layer 2 and improving the releasing ability of intaglio 1.

In the description above, the first and second releasing layers have been formed by dipping; however, other methods, including spraying and other coating method and printing method, may be used.

The method in accordance with this embodiment has the merits shown below.

Since the second releasing layer is physically adsorbed on the first releasing layer, the conductive paste is peeled from the intaglio at the interface between the second layer and the conductive paste, or at the interface between the first and second layers, so that printing is ensured. At this time, the second layer also serves as a protective layer for the first layer, thus preventing the deterioration of the first layer every time the intaglio is used for printing.

Moreover, only physically adsorbed on the first layer, the second layer can be added prior to printing as required. Even when the first layer is unevenly formed, the second layer complements it so that the releasing ability of the intaglio remains constant. In contrast, when the second layer is unevenly formed, the releasing ability of the intaglio can be kept constant because the first layer is formed.

In addition, when the intaglio is dipped into a solution containing a releasing agent for forming a releasing layer on the intaglio surface, ultrasonic vibration is applied. The ultrasonic vibration can remove the bubbles entrapped in the grooves of the intaglio, thus ensuring the reaction of the releasing agent with the intaglio and formation of the uniform releasing layers on the surface of the intaglio.

As described above, according to the present invention, formation of a dual releasing layer on the surface of an intaglio ensures its stable releasing ability. Even when the same intaglio is repeatedly used for printing, stable releasing ability can be maintained. Furthermore, even when a finer wiring pattern is processed on the intaglio, uniform releasing layers can be formed on its surface. These advantages can decrease printing failures caused by the conductive paste left in the intaglio grooves at printing and improve the durability of the releasing ability of the intaglio.

In the above description, the invention is explained in respect to a method of forming conductive patterns. However, the method in accordance with the present invention is not limited to the above-mentioned conductive pattern formation, but can effectively be used in manufacturing electronic components involving fine patterns such as resistor patterns, dielectric patterns, insulator patterns, inductor patterns, and marking patterns.

In the above description, the invention is also explained in respect to an example in which a ceramic substrate is used as a substrate onto which printings are transferred. It can easily be understood that, besides ceramic substrates, the method of manufacturing electronic components according to the present invention can also be applied to conventionally known substrates such as phenol based or epoxy based laminated substrates, resin substrates, resin sheets or the like.

What is claimed is:

1. A method of manufacturing electronic components by transferring material onto a substrate using an intaglio to form a pattern, said method comprising:

using an intaglio having a dual releasing layer structure, said structure having a first releasing layer on a surface of said intaglio and a second releasing layer on said first releasing layer, wherein said first releasing layer is formed by a chemical reaction with the surface of said intaglio.

2. A method of manufacturing electronic components as described in claim 1 wherein ultrasonic vibration is applied when at least one of said first releasing layer and said second releasing layer is formed.

3. method of manufacturing electronic components as described in claim 1 wherein said second releasing layer is re-formed on the surface of said intaglio after said intaglio has been used at least once.

4. A method of manufacturing electronic components as described in claim 1 wherein said material is a conductive material.

5. A method of manufacturing electronic components as described in claim 1 wherein said pattern is a conductive pattern.

6. A method of manufacturing electronic components as described in claim 1 wherein said pattern is one of resistor pattern, dielectric pattern, insulator pattern, inductor pattern and marking pattern.

7. A method of manufacturing electronic components as described in claim 1 wherein said substrate is a ceramic substrate.

8. A method of manufacturing electronic components as described in claim 1 wherein said substrate is one of phenol based laminated substrate, epoxy based laminated substrate, resin substrate and resin sheet.

9. A method of manufacturing electronic components by transferring material onto a substrate using an intaglio to form a pattern, said method comprising:

using an intaglio having a dual releasing layer structure, said structure having a first releasing layer on a surface of said intaglio and a second releasing layer on said first releasing layer, wherein said second releasing layer is physically adsorbed on said first releasing layer.

* * * * *